(12) United States Patent
Takenaka et al.

(10) Patent No.: US 9,400,434 B2
(45) Date of Patent: Jul. 26, 2016

(54) EXPOSURE APPARATUS, EXPOSURE METHOD, AND DEVICE MANUFACTURING METHOD

(71) Applicant: CANON KABUSHIKI KAISHA, Tokyo (JP)

(72) Inventors: Tsutomu Takenaka, Utsunomiya (JP); Kazuhiko Mishima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/494,050

(22) Filed: Sep. 23, 2014

(65) Prior Publication Data
US 2015/0092169 A1    Apr. 2, 2015

(30) Foreign Application Priority Data
Sep. 27, 2013   (JP) ................................. 2013-201876

(51) Int. Cl.
*G03B 27/52*     (2006.01)
*G03B 27/42*     (2006.01)
*G03F 7/20*      (2006.01)

(52) U.S. Cl.
CPC ........ *G03F 7/70358* (2013.01); *G03F 7/70191* (2013.01); *G03F 7/70458* (2013.01); *G03F 7/70525* (2013.01)

(58) Field of Classification Search
CPC ............................... G03F 7/70191; G03F 7/20
USPC ......................................... 355/52, 53, 55, 67
See application file for complete search history.

(56) References Cited

U.S. PATENT DOCUMENTS

| 5,793,471 | A | 8/1998 | Kanda et al. |
|---|---|---|---|
| 5,863,680 | A * | 1/1999 | Kawakubo ................ G03F 7/20 430/22 |
| 6,327,022 | B1 | 12/2001 | Nishi |
| 6,383,940 | B1 * | 5/2002 | Yoshimura .......... G03F 7/70075 355/52 |

(Continued)

FOREIGN PATENT DOCUMENTS

| CN | 1869817 A | 11/2006 |
|---|---|---|
| CN | 101611352 A | 12/2009 |

(Continued)

OTHER PUBLICATIONS

Chinese Office Action issued in counterpart application No. CN201410503036.1, dated Jan. 28, 2016. English translation provided.

*Primary Examiner* — Hung Henry Nguyen
(74) *Attorney, Agent, or Firm* — Rossi, Kimms & McDowell LLP (57) ABSTRACT

An exposure apparatus includes a controller configured to control scanning of an original holding unit and a substrate holding unit to expose a first pattern forming area onto a plurality of second pattern forming areas formed in advance on the substrate. The first pattern forming area is superimposed on the plurality of second pattern forming areas. An original may include the first pattern forming area in plural. The controller is configured to change the operation of the original holding unit or the substrate holding unit among the plurality of second pattern forming areas based on a state of the second pattern forming areas or a state of the first pattern forming areas while the first pattern forming areas are scanning-exposed onto the plurality of second pattern forming areas in a single scanning between the original holding unit and the substrate holding unit.

17 Claims, 6 Drawing Sheets

(56) References Cited

U.S. PATENT DOCUMENTS

| | | |
|---|---|---|
| 8,638,422 B2 | 1/2014 | Shiraishi |
| 9,256,138 B2 | 2/2016 | Fang et al. |
| 2002/0036762 A1 | 3/2002 | Nishi |
| 2008/0165333 A1* | 7/2008 | Kumazawa et al. ............ 355/53 |
| 2008/0212056 A1 | 9/2008 | Shiraishi |
| 2011/0075120 A1 | 3/2011 | Ichinose |

FOREIGN PATENT DOCUMENTS

| | | |
|---|---|---|
| CN | 102549504 A | 7/2012 |
| CN | 102692820 A | 9/2012 |
| JP | 2000228344 A | 8/2000 |

* cited by examiner

EXPOSURE APPARATUS, EXPOSURE METHOD, AND DEVICE MANUFACTURING METHOD

BACKGROUND OF THE INVENTION

1. Field of the Invention

The present invention relates to an exposure apparatus, an exposure method, a device manufacturing method.

2. Description of the Related Art

Exposure apparatuses exposes a pattern of an original (reticle or the like) onto a photosensitive substrate (e.g., wafer or the like where the surface thereof is coated with a resist layer) via a projection optical system in a lithography step included in manufacturing steps for semiconductor devices, liquid crystal display devices, and the like. Among them, in particular, a step-and-scan type exposure apparatus performs exposure while synchronously scanning an original and a substrate. An area to be exposed by a single scanning exposure on a substrate is referred to as a "shot" (pattern forming area), and an exposure apparatus sequentially exposes a plurality of shots preset on a substrate. Note that the projection magnification of a projection optical system which may be employed in such an exposure apparatus is typically ¼. Hereinafter, an exposure apparatus including a projection optical system having a ¼ projection magnification is referred to as a "¼ projection exposure apparatus".

Here, one of performances required for such exposure apparatuses is superimposing accuracy. In order to improve the superimposing accuracy, it is required that an original and a substrate are synchronously scanned with high accuracy. Japanese Patent Laid-Open No. 2000-228344 discloses a scanning exposure apparatus that corrects the target position of an original or a substrate depending on the scan position in a shot in order to improve superimposing accuracy (mix-and-match accuracy) between different exposure apparatuses.

In addition, an error may occur on the arrangement state of shots had subjected to one-time exposure, and thus, it is desirable that a step position is corrected in advance by measuring the arrangement state of shots based on the positions of the shots formed on a substrate. Such correction (measurement) is typically referred to as "global alignment measurement (AGA measurement)". Furthermore, there is an exposure apparatus (hereinafter referred to as "½ projection exposure apparatus") having a small reduction magnification, which employs, for example, a ½ projection optical system, for the improvement in throughput thereof. Upon exposure of the original having the same size as that of the original exposed by, for example, the ¼ projection exposure apparatus, the ½ projection exposure apparatus can expose a larger area on a substrate by a single scanning exposure, resulting in a reduction in scanning exposure times and a further improvement in throughput.

However, when mix-and-match is performed between the ½ projection exposure apparatus and the ¼ projection exposure apparatus, a superimposing error may occur due to the difference in size of shots for exposure between the exposure apparatuses. For example, in the ¼ projection exposure apparatus, two shot areas exposed by double scanning through the intermediary of stepwise movement may include a step error. In contrast, the ½ projection exposure apparatus exposes the same areas by a single scanning, resulting in no occurrence of a step error. Due to the presence of such a difference, i.e., due to the occurrence of an error caused by mix-and-match between exposure apparatuses (e.g., the ½ projection exposure apparatus and the ¼ projection exposure apparatus) having different projection magnifications, it is difficult to superimpose (overlay) an original on a substrate with high accuracy.

SUMMARY OF THE INVENTION

The present invention provides, for example, an exposure apparatus which is advantageous for performing mix-and-match with another exposure apparatus employing a projection optical system having a different projection magnification with high accuracy.

According to an aspect of the present invention, an exposure apparatus that exposes an image of a pattern formed on an original onto a substrate as a first pattern forming area through a first projection optical system having a first projection magnification is provided that includes an original holding unit configured to hold the original; a substrate holding unit configured to hold the substrate; and a controller configured to control scanning of the original holding unit and the substrate holding unit so as to expose the first pattern forming area onto a second pattern forming area exposed in advance on the substrate via a second projection optical system having a second projection magnification differing from the first projection magnification with the first pattern forming area superimposed on the second pattern forming areas, wherein the original has the pattern in plural, and the controller is configured to change the operation of the original holding unit or the substrate holding unit among the plurality of second pattern forming areas based on the state of the second pattern forming areas or the state of the patterns formed on the original while the first pattern forming areas are scanning-exposed onto the plurality of second pattern forming areas in a single scanning between the original holding unit and the substrate holding unit.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Figure 1A:
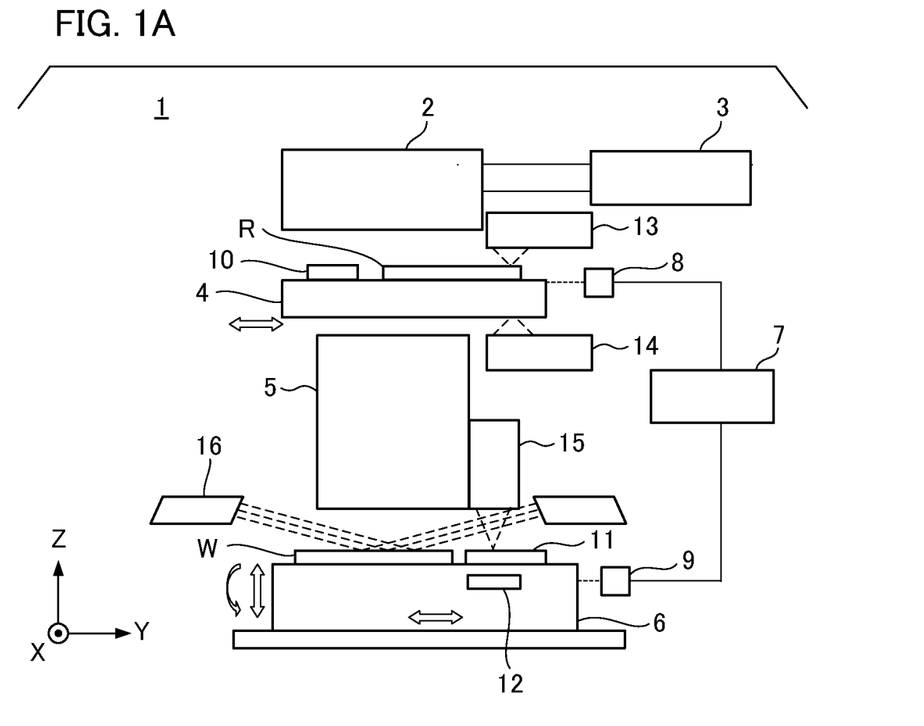
FIGS. 1A and 1B illustrate a configuration of an exposure apparatus according to a first embodiment of the present invention.
Figure 1B:
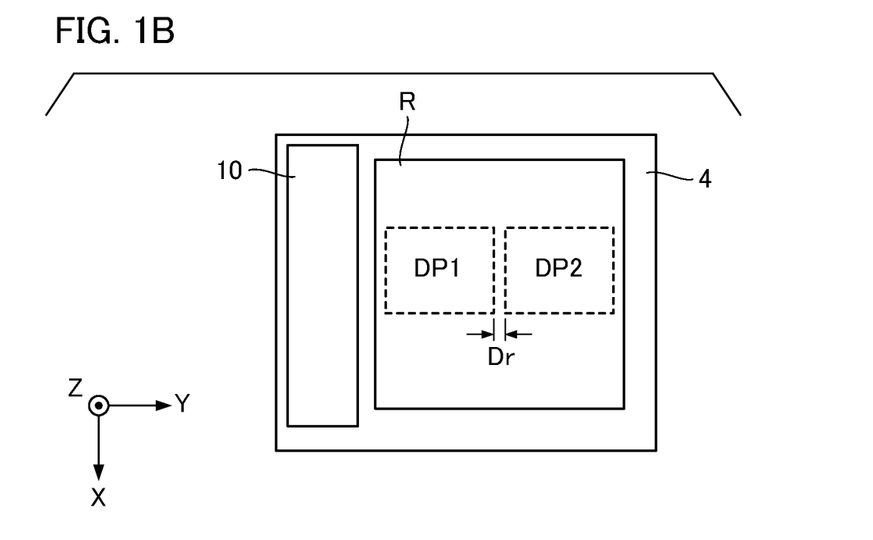

Firstly, a description will be given of an exposure apparatus according to a first embodiment of the present invention. FIGS. 1A and 1B are schematic diagrams each illustrating a configuration of an exposure apparatus 1 according to the present embodiment. In particular, FIG. 1A is a general side view of the exposure apparatus 1. As an example, the exposure apparatus 1 is a projection type exposure apparatus that is used in the steps of manufacturing semiconductor devices and exposes (transfers) a pattern formed on a reticle R onto a wafer W (onto a substrate) using a step-and-scan system. The exposure apparatus 1 includes an illumination system 2, a reticle stage 4 for holding the reticle R, a projection optical system 5, a wafer stage 6 for holding the wafer W, and a controller 7. In FIGS. 1A and 1B, the Z axis is aligned parallel to the optical axis (vertical direction in the present embodiment) of the projection optical system 5, the Y axis is aligned in the scan direction of the reticle R and the wafer W upon exposure within a plane perpendicular to the Z axis, and the X axis is aligned in the non-scan direction orthogonal to the Y axis.

The illumination system 2 receives light emitted from a light source 3, and then forms an exposure area (specific illumination shape) in a band shape elongated in the X-axis direction or in an arcuate shape onto the reticle R. In order to form such an exposure area, a light-shielding plate (not shown) is disposed in the illumination system 2 or in the vicinity thereof. The reticle R is, for example, an original made of quartz glass, where a pattern to be transferred (e.g., circuit pattern) is formed on the wafer W. Note that a pattern (device pattern DP) formed on the reticle R will be described below. The reticle stage (original holding unit) 4 is movable in both the X-axis and Y-axis directions while holding the reticle R. The projection optical system 5 projects an image of a pattern formed on the reticle R illuminated by light from the illumination system 2 onto the wafer W at a predetermined projection magnification (in particular, ½ projection magnification in the present embodiment). The wafer W is a substrate made of single crystal silicon. A resist (photoresist) is coated on the surface of the wafer W. The wafer stage (substrate holding unit) 6 is movable in the X-axis, Y-axis, and Z-axis directions while holding the wafer W via a chuck (not shown). The reticle R held by the reticle stage 4 and the wafer W held by the wafer stage 6 are optically arranged at positions (the object plane and the image plane of the projection optical system 5) substantially conjugate to each other via the projection optical system 5. While both the reticle stage 4 and the wafer stage 6 are scanning at speeds in the ratio depending on the projection magnification of the projection optical system 5 within the plane perpendicular to the optical axis of the projection optical system 5, the pattern formed on the reticle R is projected onto the wafer W, resulting in exposure of the resist coated on the wafer W. Here, one pattern forming area on the wafer W to be exposed by scanning exposure is referred to as a "shot". Hereinafter, the term "shot" has the same meaning as a pattern being exposed onto the wafer W for ease of explanation. The position of the reticle stage 4 is determined by measuring the distance between a reference mirror (not shown) secured on the reticle stage 4 side and a laser interferometer 8 by the laser interferometer 8. Likewise, the position of the wafer stage 6 is determined by measuring the distance between a reference mirror (not shown) secured on the wafer stage 6 side and a laser interferometer 9 by the laser interferometer 9. As such a position measuring device, an encoder, a capacitance sensor, or the like may also be employed other than a laser interferometer.

When the reticle R having the same outer shape as that of the reticle R exposed by another exposure apparatus (¼ projection exposure apparatus) employing the ¼ projection optical system is used, the exposure apparatus 1 employing the ½ projection optical system 5 can expose a larger area on the wafer W by a single scanning exposure. Note that the reticle R used herein has the same outer shape but has a different device size. FIG. 1B is a schematic plan view illustrating the reticle R and a configuration thereof on the reticle stage 4. The reticle R has a plurality of device patterns. In particular, in the present embodiment, the reticle R has two device patterns DP1 and DP2 as an example. For example, the ½ projection exposure apparatus such as the exposure apparatus 1 can expose two device patterns by a single scanning exposure where the device pattern DP1 has a device size which can be exposed onto the wafer W at maximum by the ¼ projection exposure apparatus by a single scanning exposure. Here, the device pattern DP2 has the same device size as that of the device pattern DP1. Although the device pattern DP2 is typically the same as the device pattern DP1, the device pattern DP2 may also have a device size or a pattern which is different from the device pattern DP1. Here, the spacing between the device pattern DP1 and the device pattern DP2 is defined as "Dr".

A first reference plate 10 in which a pattern (mark) serving as a reference mark on the reticle R side is formed on the patterned surface thereof is arranged on the surface of the reticle stage 4 in the vicinity of the reticle R being held. The patterned surface of the first reference plate 10 is located substantially in the same plane as the patterned surface of the reticle R. A first mark (not shown) which is a mark for measurement on the reticle R side and is formed of a thin film made of a metal such as Cr, Al, Ta, or the like is provided on the patterned surface of the first reference plate 10. While the number of the first reference plates 10 provided therein is one in the example shown in FIG. 1B, the first reference plate 10 may also be provided in plural. Furthermore, the first mark may also be formed on the reticle R instead of the first reference plate 10.

Likewise, a second reference plate 11 on which a pattern serving as a reference mark on the wafer W side is formed is arranged on the surface of the wafer stage 6 in the vicinity of the wafer W being held. Here, the patterned surface of the second reference plate 11 is located substantially in the same plane as the top surface of the wafer W. A second mark (not shown) which is a mark for measurement on the wafer W side and is formed of a thin film made of a metal such as Cr, Al, Ta, or the like is provided on the patterned surface of the second reference plate 11. A light amount sensor 12 is provided in the wafer stage 6 below the second reference plate 11. The light amount sensor 12 can detect light transmitted through the second reference plate 11 on which the second mark is formed. The relative position between the reticle R or an RFS 14 (to be described below) and the second reference plate 11 can be typically measured by a measurement method called as TTR (Through The Reticle) measurement using the detected light. The imaging properties of the projection optical system 5 can also be measured by TTR measurement. While the number of each of the second reference plates 11 and the light amount sensors 12 provided therein is one in the example shown in FIG. 1A, the second reference plate 11 and the light amount sensor 12 may also be provided in plural.

The controller 7 executes operation control, calculation processing, and the like of the components of the exposure apparatus 1. Also, the controller 7 is constituted, for example, by a computer or the like including a storage device and is connected to the components of the exposure apparatus 1 via a line to thereby execute control of the components in accordance with a program or the like. Note that the controller 7 may be integrated with the rest of the exposure apparatus 1

(provided in a shared housing) or may also be provided separately from the rest of the exposure apparatus 1 (provided in a separate housing).

The exposure apparatus 1 also includes a reticle alignment sensor (hereinafter referred to as "RAS") 13 and a reticle focus sensor (hereinafter referred to as "RFS") 14 as measuring devices for measuring the relative position between the first reference plate 10 and the reticle R. The RAS 13 includes, for example, a two-dimensional imaging element or a light amount sensor and an optical element. The relative position between the RAS 13 and the reticle R in the X axis and Y-axis directions can be measured by moving the RAS 13 or the reticle stage 4. While the number of the RASs 13 provided therein is one in the example shown in FIG. 1A, the RAS 13 may also be provided in plural. For example, two RASs 13 are arranged to be spaced in the X-axis direction, and then a relative difference between measurement values obtained from the two RASs 13, so that magnification in the X-axis direction, rotation about the Z axis, and the like can be measured.

On the other hand, the RFS 14 may be, for example, a grazing-incidence type sensor. The relative position between the first reference plate 10 and the reticle R in the Z-axis direction can be measured by moving the RFS 14 or the reticle stage 4. While the number of the RFSs 14 provided therein is one in the example shown in FIG. 1A, the RFS 14 may also be provided in plural. For example, a plurality of the RFSs 14 is arranged side by side in the X-axis direction, and then the reticle stage 4 is moved in the Y-axis direction, so that the relative position between the first reference plate 10 and the reticle R in the Z-axis direction can be measured as an irregularity on the X-Y plane. While the RAS 13 is separately provided from the RFS 14, the RAS 13 may also be integrated with the RFS 14.

Furthermore, the exposure apparatus 1 includes a wafer alignment sensor (hereinafter referred to as "WAS") 15 and a wafer focus sensor (hereinafter referred to as "WFS") 16 as measuring devices for measuring the relative position between the second reference plate 11 and the wafer W. The WAS 15 includes, for example, a two-dimensional imaging element or a light amount sensor and an optical element. The WAS 15 can measure a position in the X-Y plane by measuring the pattern exposed onto the wafer W and the second mark formed on the second reference plate 11. The relative position between the second reference plate 11 and the wafer W in the X axis and Y-axis directions can be measured by moving the WAS 15 or the wafer stage 6. The WAS 15 measures a plurality of points in a shot, and then the controller 7 statistically processes these measurement coordinates and measurement values, so that the rotational component, magnification component, and distortion component of the shot can be determined. Hereinafter, the measurement is referred to as "in-shot multi-point measurement". The WAS 15 measures marks formed on a plurality of shots (sample shots) in the wafer W, and then the controller 7 statistically processes these measurement coordinates and measurement values, so that the rotational component, magnification component, and distortion component of the shot arrangement after exposure onto the wafer W can be determined. While the number of the WASs 15 provided therein is one in the example shown in FIG. 1A, the WAS 15 may also be provided in plural. For example, two WASs 15 are arranged to be spaced in the X-axis direction, and then a relative difference between measurement values obtained from the two WASs 15, so that magnification in the X-axis direction, rotation about the Z axis, and the like can be measured. In contrast, two WASs 15 are arranged to be spaced in the Y-axis direction, and then a relative difference between measurement values obtained from the two WASs 15, so that magnification in the Y-axis direction, rotation about the Z axis, and the like can be measured.

On the other hand, the WFS 16 may be, for example, a grazing-incidence type sensor. The relative position between the second reference plate 11 and the wafer W in the Z-axis direction can be measured by moving the WFS 16 or the wafer stage 6. While the number of the WFSs 16 provided therein is one in the example shown in FIG. 1A, the WFS 16 may also be provided in plural. For example, a plurality of the WFSs 16 is arranged side by side in the X-axis direction, and then the wafer stage 6 is moved in the Y-axis direction, so that the relative position between the second reference plate 11 and the wafer W in the Z-axis direction can be measured as an irregularity on the X-Y plane. The position of the point to be exposed on the wafer W in the Z-axis direction can be measured prior to reaching the optical axis of the projection optical system 5 by arranging a plurality of the WFSs 16 along the scanning exposure direction. Measurement of the position of the point to be exposed on the wafer W in the Z-axis direction in advance has an advantage for readily correcting the position of the wafer stage 6 in the Z-axis direction. While the WAS 15 is separately provided from the WFS 16, the WAS 15 may also be integrated with the WFS 16.

Next, a description will be given of the ¼ projection exposure apparatus and the method for performing mix-and-match with high accuracy. Here, the term "mix-and-match" refers to an exposure method for exposing a pattern onto different layers of a wafer using different exposure apparatuses (e.g., a step-and-scan type exposure apparatus and a step-and-repeat type exposure apparatus). Conventionally, in particular, in the lithography step of manufacturing semiconductor devices, a step-and-repeat type exposure apparatus called a "stepper" is often used. In contrast, in the case of the enlargement of a chip size in association with miniaturization in size of elements and increased integration of elements, it may be advantageous to use a step-and-scan type exposure apparatus called a "scanner" which exposes an illumination area having a slit-like shape while synchronously scanning a reticle and a wafer. However, scanners typically have a lower throughput than steppers. Accordingly, mix-and-match exposure may be useful in this case by taking into consideration of the efficient utilization of an existing facility including exposure apparatuses.

Figure 2A:
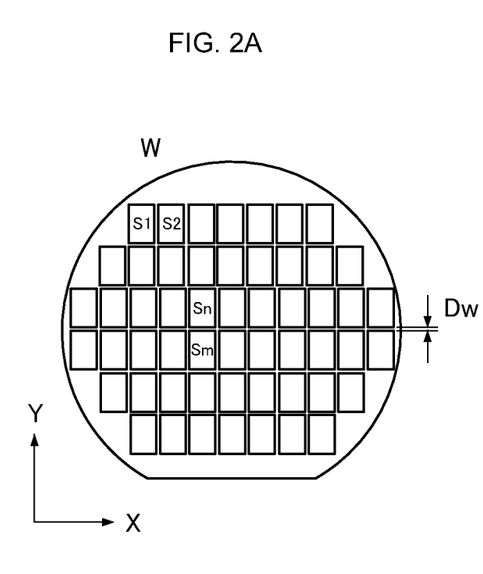
FIGS. 2A, 2B, and 2C illustrate a correction target according to the first embodiment.

FIGS. 2A to 2C are diagrams each illustrating the exposure position of a shot to be corrected according to the present embodiment. Firstly, FIG. 2A is a plan view illustrating a plurality of shots, which are formed (exposed) in advance on the wafer W by the ¼ projection exposure apparatus, indicated by rectangular solid lines, respectively. The respective shots are designated by reference numerals S1, S2, . . . , Sm, Sn, . . . for convenience of description. Note that these shot reference numerals are different from the sequence of exposure.

Figure 2B:
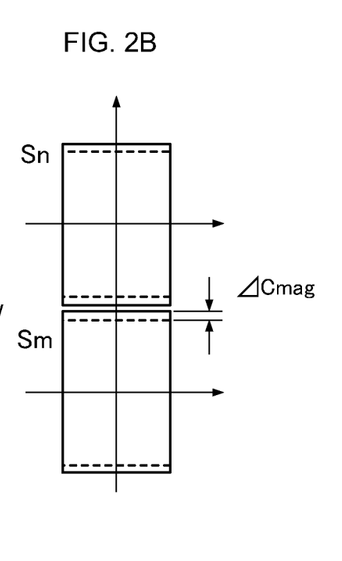

FIG. 2B is an enlarged view illustrating two shots Sm and Sn which are juxtaposed with one another in the Y-axis direction shown in FIG. 2A. In FIG. 2B, the state of a shot which has already been formed in the previous exposure step is indicated by a solid line, and the state of a shot superimposed on the shot formed in the previous exposure step without application of the present embodiment is indicated by a broken line. Here, the term "superimpose" refers to further expose a shot (first pattern forming area) onto a plurality of shots (second pattern forming area) which have already been exposed onto a substrate using an exposure apparatus. The solid line is enlarged with respect to the broken line in the Y-axis direction, resulting in the occurrence of a shot magnification error $\Delta C_{mag}$ exceeding an allowable range. Note that the shot magnification error $\Delta C_{mag}$ may be determined by in-shot multi-point measurement using the WAS 15 as a measuring device for measuring the shape of a shot. The controller 7 may also store the shot magnification error $\Delta C_{mag}$, i.e., the result obtained by previous superimposing exposure using a wafer (pilot wafer), as an offset in a storage device so as to use it as a reference as appropriate. When mix-and-match is performed between conventional ¼ projection exposure apparatuses, the shot magnification error $\Delta C_{mag}$ can be corrected by adjusting the relative scan speed between the reticle stage and the wafer stage. In particular, since the state of a shot indicated by a solid line is enlarged with respect to the state of a shot indicated by a broken line in this case, the scan speed of the wafer stage may be set to be faster than that of the reticle stage. For example, upon movement from the shot Sm to the shot Sn serving as the next exposure target after exposure of the shot Sm, the shot Sn is exposed at the same scan speed as that for the shot Sm by a stepwise movement of a predetermined amount, so that the shot Sn can also be preferably exposed.

Figure 2C:
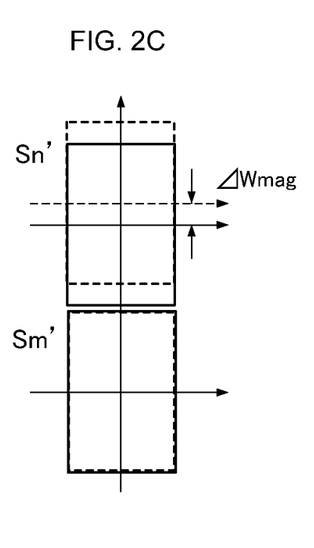

In contrast, in the case of the conventional ½ projection exposure apparatus, another deficiency may occur only by changing the scan speed during a single scanning exposure as described above. FIG. 2C is an enlarged view illustrating two shots Sm' and Sn' at this time. The state of the shot Sm' is obtained as a result of adjusting the scan speed for correcting the shot magnification error $\Delta C_{mag}$ shown in FIG. 2B, and thus, the shot Sm' is preferably exposed. However, since the ½ projection exposure apparatus performs collective scanning exposure for an area of two shots, movement from the shot Sm' to the shot Sn' is not performed stepwise but is performed during a collective scanning exposure. Thus, the shot Sn' is exposed at the scan speed adjusted for the shot Sm', resulting in a change in the spacing between the shot Sm' and the shot Sn'. Consequently, an error $\Delta W_{mag}$ occurs with respect to the center of the shot Sn in the Y-axis direction. Accordingly, in the present embodiment, the scan speed is corrected by taking into consideration of the spacing between the shot Sm' and the shot Sn' to be subject to collective scanning exposure as described below.

Firstly, when it is assumed that the relative speed between the reticle stage 4 and the wafer stage 6 is constant, the relationship given in Formula (1) is satisfied:

[Formula 1]

$$\frac{Vr}{Vw} = \frac{1}{\beta} \quad (1)$$

"Vr" represents the speed of the reticle stage 4, "Vw" represents the speed of the wafer stage 6, and "β" represents the projection magnification of the projection optical system 5. When the scan speed is adjusted in the state where the shot magnification error $\Delta C_{mag}$ occurs, Formula (2) is obtained by introducing a variable $\alpha_{cmag}$ having the relationship with the shot magnification error $\Delta C_{mag}$ into Formula (1):

[Formula 2]

$$\frac{Vr}{Vw} = \frac{1}{\beta} \times \alpha_{cmag} \quad (2)$$

Upon scanning exposure for the shots Sm and Sn under the condition, the speed Vw needs to be fast or the speed Vr needs to be slow in Formula (1), resulting in the relationship of $\alpha_{cmag} < 1$. Furthermore, the speed also needs to be changed for the spacing Dw between the shot Sm and the shot Sn. The speed is represented by Formula (3):

[Formula 3]

$$\frac{Vr}{Vw} = \frac{Dr}{Dw} \quad (3)$$

Figure 3A:
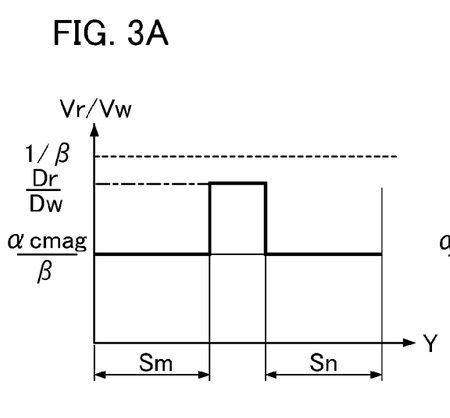
FIGS. 3A, 3B, and 3C are graphs each illustrating the relative speed of a stage according to the first embodiment.

FIGS. 3A to 3C are graphs each illustrating the changed (corrected) relative speed (scan speed). The shots Sm and Sn are present in the Y-axis direction which is the scan direction, scanning is performed on the shot Sm and the shot Sn at a speed represented by Formula (2), and scanning is performed on the distance between the shot Sm and the shot Sn at a speed represented by Formula (3). FIG. 3A shows an ideal state in which the relative speed is momentarily changed in association with the position of the scan direction. However, in practice, an acceleration period or a deceleration period is required upon changing the speed of the reticle stage 4 and the wafer stage 6. In addition, an exposure area at the time of scanning exposure is formed into a finite size by a light-shielding plate. Although strictly speaking, the shots Sm and Sn cannot be completely separated from the boundary area between the shot Sm and the shot Sn. Hence, it is preferable that the relative speed is stepwisely changed in the boundary area so as to connect the speed indicated in Formula (2) with the speed indicated in Formula (3).

Figure 3B:
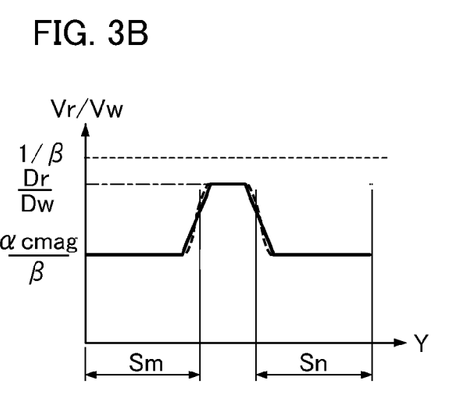

FIG. 3B is a graph illustrating a relative speed which is stepwisely changed so as to connect the speed indicated in Formula (2) with the speed indicated in Formula (3). A solid line which is a straight line for connecting the speed indicated in Formula (2) with the speed indicated in Formula (3) and a broken line which is a curved line for connecting the speed indicated in Formula (2) with the speed indicated in Formula (3) are shown in FIG. 3B. In the step-and-scan type exposure apparatus, the scan speed is in intimate relationship with the amount of exposure and the amount of exposure decreases with an increase in the scan speed. Thus, in the case of a change as shown in FIG. 3B, it is preferable to increase the amount of exposure in the vicinity of the end position of scanning exposure for the shot Sm where the relative speed becomes fast and in the vicinity of the start position of scanning exposure for the shot Sn in order to maintain the amount of exposure constant.

Figure 3C:
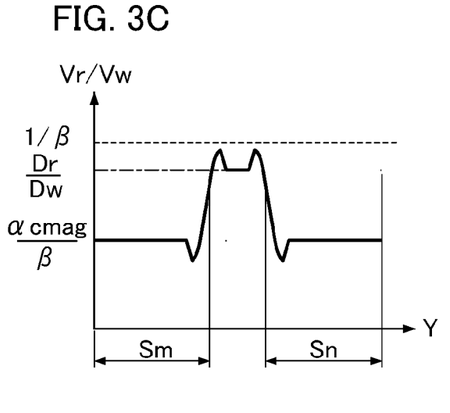

FIG. 3C is a graph illustrating a relative speed which is stepwisely changed so as to connect the speed indicated in Formula (2) with the speed indicated in Formula (3) with respect to the relative speed shown in FIG. 3B. Here, the relative speed between the reticle stage 4 and the wafer stage 6 is temporarily decelerated prior to acceleration in the vicinity of the end position of scanning exposure for the shot Sm, so that the amount of exposure increases without changing illuminance so as to average an increase in the amount of exposure and a decrease in the amount of exposure upon acceleration. Note that the range for averaging is the entire exposure area to be formed by a light-shielding plate. Likewise, the amount of exposure is also averaged by changing the relative speed in the vicinity of the start position of scanning exposure for the shot Sn. While acceleration/deceleration of the relative speed is represented by a curved line in FIG. 3C, acceleration/deceleration of the relative speed may also be represented by a straight line or a combination of a curved line and a straight line. Note that the relative speeds shown in FIGS. 3A to 3C are determined by the controller 7 using Formulas (2) and (3) as described above, and are adjusted by controlling the speed Vr of the reticle stage 4 and the speed Vw of the wafer stage 6. In other words, speed control is managed based on information obtained from two different shots Sm and Sn. Thus, the relative speed is smaller than 1/β in FIGS. 3A to 3C but is not limited thereto. The relative speed may also be greater than 1/β.

As described above, the exposure apparatus 1 can perform mix-and-match with another exposure apparatus employing a projection optical system having a different projection magnification with high accuracy even when the shot magnification error $\Delta C_{mag}$ occurs.

As described above, according to the present embodiment, an exposure apparatus which is advantageous for performing mix-and-match with another exposure apparatus employing a projection optical system having a different projection magnification with high accuracy may be provided.

It is assumed in the present embodiment that the shot magnification error $\Delta C_{mag}$ which may occur in the shot Sm is the same as that which may occur in the shot Sn. In contrast, when the shot magnification error $\Delta C_{mag}$ is different between the shots Sm and Sn, the scan speeds may respectively be optimized upon exposure of the shot Sm and upon exposure of the shot Sn. Furthermore, it is preferable that the projection magnification of the projection optical system 5 is changed depending on the shot magnification error $\Delta C_{mag}$ for each of the shots Sm and Sn. It is also assumed in the present embodiment that the shot magnification error $\Delta C_{mag}$ caused by the device pattern DP1 on the reticle R is the same as that caused by the device pattern DP2 on the reticle R. In contrast, when the shot magnification error $\Delta C_{mag}$ is different between the device patterns DP1 and DP2, the scan speeds may respectively be optimized upon exposure of the device pattern DP1 and upon exposure of the device pattern DP2. Here, the expression "different between the device patterns DP1 and DP2" refers to the case where the device patterns DP1 and DP2 have different device sizes themselves or the case where the device patterns DP1 and DP2 have manufacturing errors occurred upon manufacturing the reticle R.

Second Embodiment

Next, a description will be given of an exposure apparatus according to a second embodiment of the present invention. In the first embodiment, a description has been given of the case where a magnification error occurs in a shot. In contrast, a feature of the exposure apparatus according to the present embodiment lies in the fact that the exposure apparatus performs mix-and-match with another exposure apparatus employing a projection optical system having a different projection magnification as in the first embodiment but mix-and-match is particularly applied to the case where a rotational error occurs in a shot. The configuration of the exposure apparatus according to the present embodiment is the same as that of the exposure apparatus 1 according to the first embodiment, and the same reference numerals as used in the first embodiment are used in the following description.

Figure 4A:
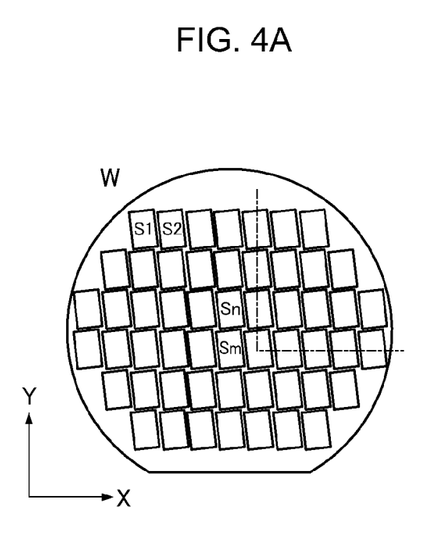
FIG. 4A and FIG. 4B illustrate a correction target according to a second embodiment.

FIGS. 4A and 4B are diagrams each illustrating the exposure position of a shot to be corrected according to the present embodiment. FIG. 4A is a plan view illustrating a plurality of shots, which are formed in advance on the wafer W by the ¼ projection exposure apparatus, indicated by rectangular solid lines, respectively. In particular, FIG. 4A shows the state where these shots have a rotational error of the angle θ exceeding an allowable range. Note that the angle θ is an angle on the surface of the wafer W, more specifically, within a vertical plane in the direction of the optical axis of the projection optical system 5. It is assumed that no arrangement error occurs between shots. When the shots exposed by two exposure apparatuses each provided with a projection optical system having the same projection magnification are superimposed with each other, exposure is performed by rotating the reticle R or the wafer W or rotating both the reticle R and the wafer W, so that the shots can be preferably superimposed with each other.

Figure 4B:
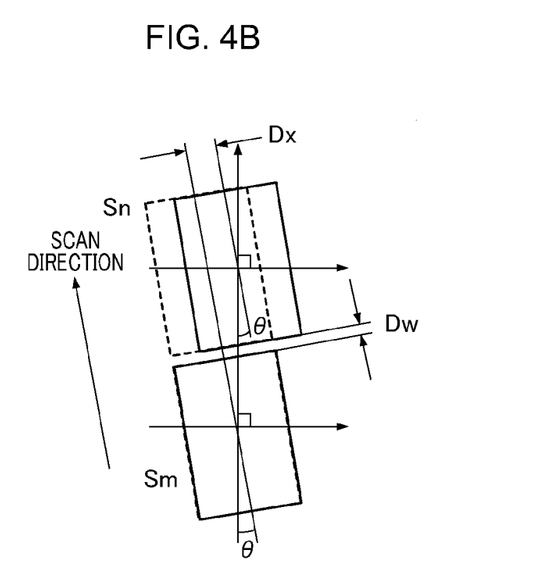

In contrast, when mix-and-match is performed between the ½ projection exposure apparatus and the ¼ projection exposure apparatus, a deficiency may occur as shown in FIG. 4B. FIG. 4B is an enlarged view illustrating two shots Sm and Sn which are juxtaposed with one another in the Y-axis direction shown in FIG. 4A. In FIG. 4B, the state of a shot which has already been exposed in the previous exposure step using the ¼ projection exposure apparatus is indicated by a solid line. When exposure is performed by rotating the reticle R or the wafer W or rotating both the reticle R and the wafer W in order to correct the shot rotational error θ by the ½ projection exposure apparatus, preferable superimposition is achieved on the shot Sm as shown in FIG. 4B. However, the shot Sn is exposed in a state indicated by a broken line, an error occurs by the amount of Dx indicating the distance between the shot indicated by a broken line and the actually formed shot indicated by a solid line. Accordingly, in the present embodiment, the error Dx is reduced by changing the position of the wafer stage 6 in the X-axis direction in accordance with the state of the shots Sm and Sn depending on the Y coordinate of the wafer stage 6 during scanning exposure. Note that the shot rotational error θ and the error Dx may be determined by in-shot multi-point measurement or the result obtained by previous superimposing exposure using a wafer (pilot wafer) may also be stored as an offset in a storage device of the controller 7 so as to use it as a reference as appropriate.

Figure 5A:
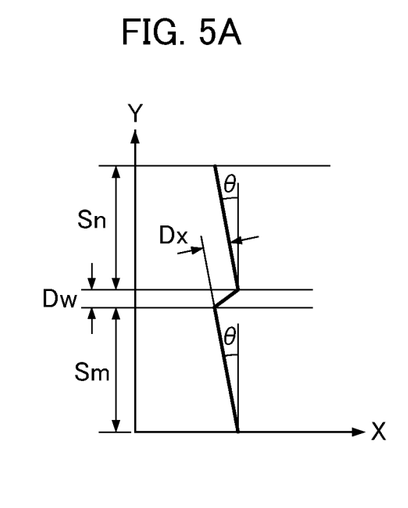
FIGS. 5A, 5B, and 5C are graphs each illustrating the movement trajectory of a stage according to the second embodiment.

FIGS. 5A to 5C are graphs each illustrating the movement trajectory of the wafer stage 6 on the XY coordinates. FIG. 5A shows the state where each of the shots Sm and Sn has the shot rotational error θ. In this case, the wafer stage 6 moves at the angle θ with respect to the Y-axis direction during scanning exposure for the shots Sm and Sn. The wafer stage 6 moves so as to connect the end position of scanning exposure for the shot Sm to the start position of scanning exposure for the shot Sn in the section corresponding to the spacing Dw between the shot Sm and the shot Sn. Note that the scan speed in the section corresponding to the spacing Dw is associated with the spacing Dr between the device pattern DP1 and the device pattern DP2 on the reticle R as described in the first embodiment. When both the shots Sm and Sn have a rotational error but have no shot arrangement error, favorable mix-and-match can be realized on the shots Sm and Sn indicated by solid lines in FIG. 4B by driving the wafer stage 6 as described above.

However, when the spacing Dw is small, an abrupt change is required for the direction of movement of the wafer stage 6. In order to accommodate an abrupt change in the direction of movement of the wafer stage 6, a large driving force is required for the wafer stage 6, such a driving force may not be met depending on the angle of the wafer stage 6. Since an exposure area at the time of scanning exposure is formed into a finite size by a light-shielding plate, the shot Sm and the shot Sn are simultaneously exposed when the spacing Dw is smaller than the exposure area in the Y-axis direction. In this case, it is difficult to clearly separate the area of the shot Sm from the area of the shot Sn, resulting in a difficulty in clearly separating the movement trajectory of the wafer stage 6.

Figure 5B:
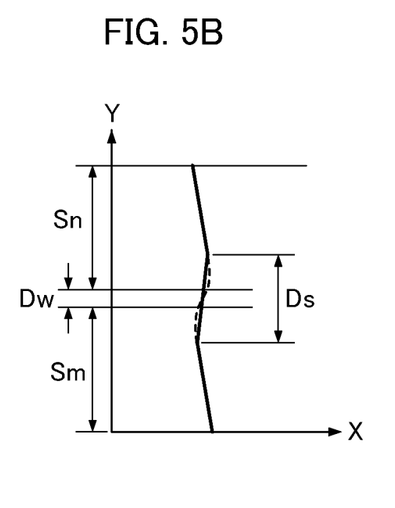

Thus, in order to accommodate the case where the spacing Dw is small, the movement trajectory of the wafer stage 6 may also be set as follows. FIG. 5B is a graph illustrating the movement trajectory of the wafer stage 6 which is capable of accommodating the case where the spacing Dw is small. In contrast to the movement trajectory shown in FIG. 5A, the movement trajectory indicated by a solid line in FIG. 5B is obtained by connecting the section of the spacing Ds from before termination of scanning exposure for the shot Sm until after start of scanning exposure for the shot Sn with the spacing Dw included therein by a straight line. The movement trajectory indicated by a broken line in FIG. 5B is obtained by connecting the section of the spacing Ds by a curved line. Even when the driving force of the wafer stage 6 is in shortage, such a movement trajectory is capable of accommodating the case where the spacing Dw is small, resulting in obtaining a favorable superimposing accuracy as a whole.

Figure 5C:
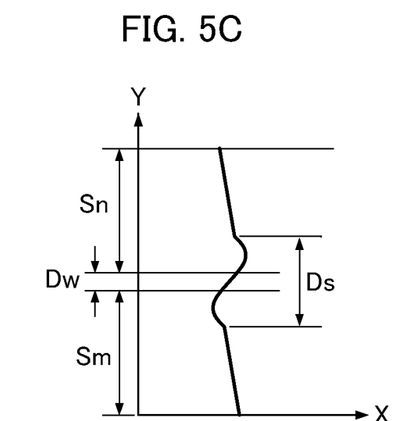

On the other hand, when the spacing Dw is small, it may be desired to further improve the superimposing accuracy in the vicinity of the end position of scanning exposure for the shot Sm and in the vicinity of the start position of scanning exposure for the shot Sn as compared with the case where the movement trajectory of the wafer stage 6 is set as shown in FIG. 5B. In such a case, the movement trajectory of the wafer stage 6 may also be set as follows. FIG. 5C is a graph illustrating the movement trajectory of the wafer stage 6, which may be set for further improvement in superimposing accuracy. In the movement trajectory shown in FIG. 5B, the wafer stage 6 moves only in the positive direction of the X axis in the vicinity of the end position of scanning exposure for the shot Sm, resulting in occurrence of a shift of the device pattern in one direction. In contrast, in the movement trajectory shown in FIG. 5C, the wafer stage 6 needs to move in the positive direction of the X axis upon movement from the shot Sm to the shot Sn but scanning is temporarily performed in the negative direction of the X axis in the vicinity of the end position of scanning exposure and then is performed in the positive direction of the X axis for the shot Sm during scanning exposure. As described above, the wafer stage 6 moves alternately in the positive direction and the negative direction of the X axis, so that the shape of the device pattern to be subject to scanning exposure is averaged, resulting in suppression of a shift of the device pattern. Note that the range for averaging is an exposure area to be formed by a light-shielding plate. Likewise, the wafer stage 6 moves alternately in the positive direction and the negative direction of the X axis in the vicinity of the start position of scanning exposure for the shot Sn, so that a shift of the device pattern for the shot Sn can be suppressed.

While the movement trajectory of the wafer stage 6 is represented by a curved line in FIG. 5C, the movement trajectory of the wafer stage 6 may also be represented by a straight line or a combination of a curved line and a straight line. The movement trajectory indicated by a solid line and a broken line in FIGS. 5B and 5C may also be obtained by the controller 7 with reference to an exposure area during scanning exposure, the response speed of the wafer stage 6, the speed of the wafer stage 6 during scanning exposure, the size of the spacing Dw, and the shot rotational error θ. While a description has been given based on the assumption that no arrangement error occurs between the shot Sm and the shot Sn, it is preferable that an arrangement error is also included in the condition for determining the movement trajectory by the controller 7 when there is an arrangement error. The speed of the wafer stage 6 during scanning exposure may be constant or variable. While, in the above description, the movement trajectory of the wafer stage 6 in the X-axis and Y-axis directions is taken into account, drive control may also be executed by taking into account the rotational component. The above description relates to the setting of the movement trajectory of the wafer stage 6 but a relative driving between the reticle stage 4 and the wafer stage 6 is required during scanning exposure. Thus, the movement trajectory of the reticle stage 4 or the movement trajectory of both the wafer stage 6 and the reticle stage 4 may also be set as described above. At this time, drive control may also be executed by taking into account the rotational component of the reticle stage 4 or the rotational components of both the wafer stage 6 and the reticle stage 4 when the rotational component is taken into account as described above.

As described above, according to the present embodiment, an exposure apparatus which is advantageous for performing mix-and-match with another exposure apparatus employing a projection optical system having a different projection magnification with high accuracy even when the shot rotational error occurs may be provided.

Third Embodiment

Next, a description will be given of an exposure apparatus according to a third embodiment of the present invention. In the above embodiments, a description has been given of the case where various errors occur on the wafer W side (shot side). In contrast, a feature of the exposure apparatus according to the present embodiment lies in the fact that the exposure apparatus performs mix-and-match with another exposure apparatus employing a projection optical system having a different projection magnification as in the first embodiment but mix-and-match is particularly applied to the case where an error occurs on the reticle R side. The configuration of the exposure apparatus according to the present embodiment is the same as that of the exposure apparatus 1 according to the first embodiment, and the same reference numerals as used in the first embodiment are used in the following description.

Figure 6:
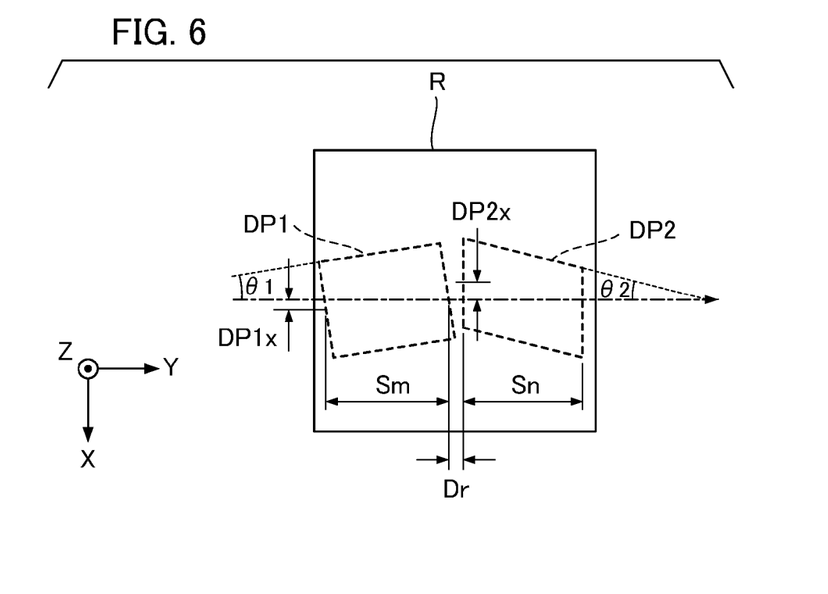
FIG. 6 illustrates a correction target according to a third embodiment.

FIG. 6 is a schematic plan view illustrating the state of the reticle R having two device patterns DP1 and DP2 each having a manufacturing error. Here, the device pattern DP1 is formed to have a rotational error θ1 which is a manufacturing error with respect to the Y axis. The rotation center of the rotational error θ1 coincides with the center of the device pattern DP1, and the device pattern DP1 has an error DP1x in the X-axis direction at the start position of scanning exposure for the shot Sm. On the other hand, the plane shape of the device pattern DP2 is to be ideally a rectangular but is a parallelogram having an angle of θ2. In other words, the device pattern DP2 has an error DP2x in the X-axis direction at the start position of scanning exposure for the shot Sn. If such a manufacturing error occurs in the reticle R, a superimposing error occurs in shots actually exposed on the wafer W even when the relative driving between the reticle stage 4 and the wafer stage 6 during scanning exposure is good. Thus, in the present embodiment, the movement trajectory of the reticle stage 4 is set as follows in order to suppress such a superimposing error. For the manufacturing errors of the device patterns DP1 and DP2, the result obtained by previous superimposing exposure using a pilot wafer may be stored as an offset in a storage device of the controller 7 so as to use it as a reference as appropriate. TTR measurement or position measurement using the RAS 13 serving as a position measuring device may also be performed for marks provided in accordance with the positions of the device patterns DP1 and DP2 formed on the reticle R so as to store the result in the above storage device.

Figure 7A:
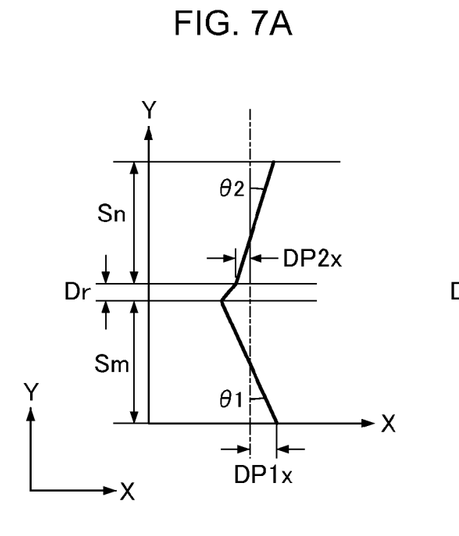
FIGS. 7A and 7B are graphs each illustrating the movement trajectory of a stage according to the third embodiment.

FIGS. 7A and 7B are graphs each illustrating the movement trajectory of the reticle stage 4 on the XY coordinates. FIG. 7A is a graph illustrating the state where the error shown in FIG. 6 occurs. Firstly, the X coordinate of the shot Sm at the start position of scanning exposure serving as the scan position is offset by the error DP1x caused by the θ1 rotation of the shot Sm with reference to the center of the shot Sm. The reticle stage 4 moves from the start position to the end position of scanning exposure at the angle of θ1 with respect to the Y axis. Next, the reticle stage 4 moves so as to connect the end position of scanning exposure for the shot Sm to the start position of scanning exposure for the shot Sn by a straight line in the section corresponding to the spacing Dr between the shot Sm and the shot Sn shown in FIG. 6. Note that the speed of the reticle stage 4 when scanning the spacing Dr is associated with the spacing Dw as indicated in Formula (3) described in the first embodiment. Furthermore, the X coordinate of the shot Sn at the start position of scanning exposure serving as the scan position is offset by the error DP2x caused by the rotation of the shot Sn by the angle θ2. The reticle stage 4 moves from the start position to the end position of scanning exposure at the angle of θ2 with respect to the Y axis.

In the present embodiment, correction control is performed for the movement of the reticle stage 4 as described above, and the wafer stage 6 may be scanned along the Y axis during correction control. In the above description, the reticle stage 4 is scanned at a certain angle with respect to the Y axis during scanning exposure for the shot Sm. Alternatively, the X coordinate of the shot Sm at the start position of scanning exposure may be set as the coordinate determined from the angle θ1 and the error DP1x by rotating the reticle stage 4 or the reticle R by an angle of θ1, such that scanning exposure is performed along the Y axis. On the other hand, the shot Sn has no rotational error. Thus, upon scanning exposure for the shot Sn, the rotation of the reticle stage 4 or the reticle R is returned to the state prior to starting scanning exposure for the shot Sm, and then scanning exposure is performed in the direction at an angle of θ2 with respect to the Y axis.

Figure 7B:
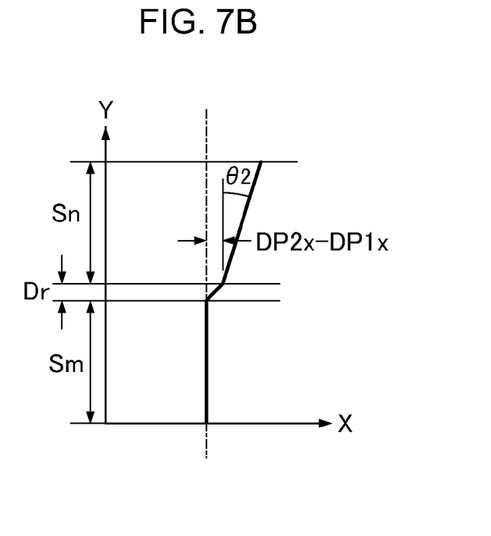

As in the case of scanning exposure for the shot Sm, scanning exposure for the shot Sn may be performed with the reticle stage 4 or the reticle R rotated by an angle of θ1. FIG. 7B is a graph illustrating the movement trajectory of the reticle stage 4 in this case. Although the movement trajectory differs from that shown in FIG. 7A, the movement trajectory can be determined based on the same concept. When the shots Sm and Sn are subject to scanning exposure based on the assumption that the reticle stage 4 and the reticle R have the same amount of rotation, the optimum amount of rotation θ3 may be determined based on the amount of angles θ1 and θ2. The amount of rotation θ3 may be the average of, for example, the angle θ1 and the angle θ2.

It may be difficult to control the driving of the reticle stage 4 and the wafer stage 6 or the rotation of the reticle R and the wafer W depending on the size of the light-shielding plate, the response speed of the reticle stage 4 and the wafer stage 6, the relationship between the distances Dr and Dw, and the like. In this case, the linear driving trajectory shown in FIGS. 7A and 7B may also be replaced with a curved line as described in the above embodiments. Here, the distance of the linear driving trajectory replaced with a curved line may be longer than the distances Dr and Dw. As in the above embodiments, the amount of exposure may also be averaged within an exposure area formed by the light-shielding plate during scanning exposure in the vicinity of the end position of scanning exposure for the shot Sm and in the vicinity of the start position of scanning exposure for the shot Sn.

While, in the above description, the reticle stage 4 or the reticle R is rotated upon correction, both the reticle stage 4 and the reticle R may also be rotated. While, in the above description, an error on the reticle R side is corrected by the driving direction and the rotation of the reticle stage 4 or by the rotation of the reticle R, an error on the reticle R side may also be corrected by the driving direction and the rotation of the wafer stage 6 or by the rotation of the wafer W.

As described above, according to the present embodiment, an exposure apparatus which is advantageous for performing mix-and-match with another exposure apparatus employing a projection optical system having a different projection magnification with high accuracy even when an error occurs on the reticle side may be provided.

While a description has been given in the above embodiments by taking an example in which the exposure apparatus is the ½ projection exposure apparatus and another exposure apparatus is the ¼ projection exposure apparatus, the present invention is also applicable to exposure apparatuses each employing a projection optical system having a different projection magnification. The above embodiments may not only be performed independently of each other but also be performed in combination.

Device Manufacturing Method

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-201876 filed on Sep. 27, 2013, which is hereby incorporated by reference herein in its entirety.

What is claimed is:

1. An exposure apparatus that exposes a pattern formed on an original onto a substrate as a first pattern forming area, the exposure apparatus comprising:
   an original holding unit configured to hold the original;
   a substrate holding unit configured to hold the substrate; and
   a controller configured to control scanning of the original holding unit and the substrate holding unit so as to expose a plurality of the first pattern forming areas onto a plurality of second pattern forming areas, formed in advance on the substrate, with the plurality of the first pattern forming areas superimposed on the plurality of second pattern forming areas, wherein the controller is configured to change an operation of the original holding unit for each of the plurality of second pattern forming areas based on a shape of the plurality of second pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

2. The exposure apparatus according to claim 1, wherein the shape of the plurality of second pattern forming areas includes an arrangement of the plurality of second pattern forming areas.

3. The exposure apparatus according to claim 1, wherein the controller is configured to change the operation of the original holding unit based on a magnification error or a rotational error between the plurality of the first pattern forming areas and the plurality of second pattern forming areas.

4. The exposure apparatus according to claim 1, wherein a change in the operation of the original holding unit includes a change in at least a scan speed, a scan direction, a scan position, or an angle within a plane perpendicular to a direction of an optical axis of a projection optical system configured to expose the plurality of the first pattern forming areas onto the plurality of second pattern forming areas.

5. The exposure apparatus according to claim 2, further comprising:
a measuring device configured to measure the shape or the arrangement of the plurality of second pattern forming areas formed on the substrate.

6. An exposure method for exposing a pattern formed on an original onto a substrate as a first pattern forming area, the exposure method comprising:
exposing a plurality of the first pattern forming areas onto a plurality of second pattern forming areas formed in advance on the substrate, with the plurality of the first pattern forming areas superimposed on the plurality of second pattern forming areas while scanning an original holding unit and a substrate holding unit, the original holding unit configured to hold the original, and the substrate holding unit configured to hold the substrate, wherein an operation of the original holding unit is changed in the exposing based on a shape of the plurality of second pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

7. A device manufacturing method comprising:
exposing a substrate using an exposure apparatus; and
developing the exposed substrate,
wherein the exposure apparatus, which exposes a pattern formed on an original onto a substrate as a first pattern forming area, comprises:
an original holding unit configured to hold the original;
a substrate holding unit configured to hold the substrate; and
a controller configured to control scanning of the original holding unit and the substrate holding unit so as to expose a plurality of the first pattern forming areas onto a plurality of second pattern forming areas, formed in advance on the substrate with the plurality of the first pattern forming areas superimposed on the plurality of second pattern forming areas, wherein the controller is configured to change an operation of the original holding unit for each of the plurality of second pattern forming areas based on a shape of the plurality of second pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

8. An exposure apparatus that exposes a pattern formed on an original onto a substrate as a first pattern forming area, the exposure apparatus comprising:
an original holding unit configured to hold the original;
a substrate holding unit configured to hold the substrate; and
a controller configured to control scanning of the original holding unit and the substrate holding unit so as to expose a plurality of the first pattern forming areas onto a plurality of second pattern forming areas, formed in advance on the substrate with the plurality of the first pattern forming areas superimposed on the plurality of second pattern forming areas, wherein the controller is configured to change an operation of the original holding unit for each of the plurality of second pattern forming areas based on a shape of the plurality of the first pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

9. The exposure apparatus according to claim 8, wherein the controller is configured to change the operation of the original holding unit based on a magnification error or a rotational error between the plurality of the first pattern forming areas and the plurality of second pattern forming areas.

10. The exposure apparatus according to claim 8, wherein the shape of the plurality of the first pattern forming areas includes a shape or an arrangement of the plurality of the first pattern forming areas.

11. The exposure apparatus according to claim 8, wherein the controller is configured to change the operation of the original holding unit based on the shape of the plurality of the first pattern forming areas in a case that a manufacturing error of the plurality of the first pattern forming areas exceeds an allowable range.

12. The exposure apparatus according to claim 8, wherein a change in the operation of the original holding unit includes a change in at least a scan speed, a scan direction, a scan position, or an angle within a plane perpendicular to a direction of an optical axis of a projection optical system configured to expose the plurality of the first pattern forming areas onto the plurality of second pattern forming areas.

13. The exposure apparatus according to claim 10, further comprising:
a position measuring device configured to measure positions of marks that are provided on the original so as to be aligned with positions where the plurality of the first pattern forming areas are formed,
wherein the controller is configured to determine the shape or the arrangement of the plurality of the first pattern forming areas based on the positions of the marks measured by the position measuring device.

14. An exposure method for exposing a pattern formed on an original onto a substrate as a first pattern forming area, the exposure method comprising:

exposing a plurality of the first pattern forming areas onto a plurality of second pattern forming areas formed in advance on the substrate, with the plurality of the first pattern forming areas superimposed on the plurality of second pattern forming areas while scanning an original holding unit and a substrate holding unit, the original holding unit configured to hold the original and the substrate holding unit configured to hold the substrate, wherein an operation of the original holding unit is changed in the exposing based on a shape of the plurality of the first pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

15. A device manufacturing method comprising:
exposing a substrate using an exposure apparatus; and
developing the exposed substrate,
wherein the exposure apparatus, which exposes a pattern formed on an original onto a substrate as a first pattern forming area, comprises:

an original holding unit configured to hold the original;
a substrate holding unit configured to hold the substrate; and
a controller configured to control scanning of the original holding unit and the substrate holding unit so as to expose a plurality of the first pattern forming areas onto a plurality of second pattern forming areas, formed in advance on the substrate with the plurality of the first pattern forming areas superimposed on the plurality of second pattern forming areas, wherein the controller is configured to change an operation of the original holding unit for each of the plurality of second pattern forming areas based on a shape of the plurality of the first pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

16. An exposure apparatus that exposes a pattern formed on an original onto a substrate as a first pattern forming area, the exposure apparatus comprising:

an original holding unit configured to hold the original;
a substrate holding unit configured to hold the substrate; and
a controller configured to control scanning of the original holding unit and the substrate holding unit so as to expose a plurality of the first pattern forming areas onto a plurality of second pattern forming areas, formed in advance on the substrate with the plurality of the first pattern forming areas superimposed on the plurality of second pattern forming areas, wherein the controller is configured to change an operation of the substrate holding unit for each of the plurality of second pattern forming areas based on a shape of the plurality of the first pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

17. An exposure apparatus that exposes a pattern formed on an original onto a substrate as a first pattern forming area, the exposure apparatus comprising:

an original holding unit configured to hold the original;
a substrate holding unit configured to hold the substrate; and
a controller configured to control scanning of the original holding unit and the substrate holding unit so as to expose a plurality of the first pattern forming areas onto a plurality of second pattern forming areas, formed in advance on the substrate, with the plurality of the first pattern forming areas superimposed on the plurality of second pattern forming areas, wherein the controller is configured to change an operation of the substrate holding unit for each of the plurality of second pattern forming areas based on a shape of the second pattern forming areas formed on the substrate or a shape of the pattern formed on the original, while the plurality of the first pattern forming areas are scanning-exposed onto the plurality of second pattern forming areas in a single scanning between the original holding unit and the substrate holding unit.

* * * * *